(12) United States Patent
Tuan

(10) Patent No.: US 7,806,311 B2
(45) Date of Patent: Oct. 5, 2010

(54) METHOD OF MANUFACTURING CERAMIC/METAL COMPOSITE STRUCTURE

(75) Inventor: Wei-Hsing Tuan, Taipei (TW)

(73) Assignee: National Taiwan University, Taipei (TW)

( * ) Notice: Subject to any disclaimer, the term of this patent is extended or adjusted under 35 U.S.C. 154(b) by 149 days.

(21) Appl. No.: 12/029,340

(22) Filed: Feb. 11, 2008

(65) Prior Publication Data
US 2008/0190542 A1    Aug. 14, 2008

(30) Foreign Application Priority Data
Feb. 14, 2007    (TW) ............... 96105446 A

(51) Int. Cl.
*B23K 31/00*    (2006.01)
(52) U.S. Cl. .............. 228/120; 228/227; 228/232; 148/217; 148/220; 148/282; 148/712
(58) Field of Classification Search .......... 228/120, 228/227, 232; 148/217, 220, 282, 712
See application file for complete search history.

(56) References Cited

U.S. PATENT DOCUMENTS

| | | | |
|---|---|---|---|
| 3,993,411 A | | 11/1976 | Babcock et al. |
| 5,465,898 A | * | 11/1995 | Schulz-Harder et al. . 228/122.1 |
| 5,980,654 A | * | 11/1999 | Quadakker .............. 148/421 |

FOREIGN PATENT DOCUMENTS

CN    1653016 A    8/2005

OTHER PUBLICATIONS

Seager et al., "The influence of CuAIO$_2$ on the strength of eutectically bonded Au/Al$_2$O$_3$ interfaces," Scripta Materialia 46 (2002), pp. 395-400.
Yoshino, "Role of Oxygen in Bonding Copper to Alumina," J. Am. Ceram. Soc., 72 [8] (1989), pp. 1322-1327.
Beraud et al., "Study of copper-alumina bonding," Journal of Materials Science 74 (1989), pp. 4545-4554.

* cited by examiner

*Primary Examiner*—Jessica L Ward
*Assistant Examiner*—Erin B Saad
(74) *Attorney, Agent, or Firm*—Muncy, Geissler, Olds & Lowe, PLLC

(57) ABSTRACT

A method of manufacturing a ceramic/metal composite structure includes the steps of: performing a multi-stage pre-oxidizing process on the copper sheet; placing the copper sheet on a ceramic substrate; and heating the copper sheet and the ceramic substrate to a joining temperature to join the copper sheet and the ceramic substrate together to enhance interface strength between the copper sheet and the ceramic substrate according to the multi-stage pre-oxidizing process. The multi-stage pre-oxidizing process includes a first stage of pre-oxidizing process and a second stage of pre-oxidizing process, and the first and second stages of pre-oxidizing processes are performed in atmospheres with different oxygen partial pressures and at different temperatures.

19 Claims, 4 Drawing Sheets

METHOD OF MANUFACTURING CERAMIC/METAL COMPOSITE STRUCTURE

BACKGROUND OF THE INVENTION

1. Field of Invention

The invention relates to a method of manufacturing a ceramic/metal composite structure, and more particularly to a method of manufacturing a composite structure composed of an aluminum oxide layer and a copper layer.

2. Related Art

Heat is generated when an electronic component is operating with electrons flowing therethrough. The generation of heat increases the resistance and blocks the flows of the electrons so that the function of the electronic component is significantly influenced. When the technology of manufacturing the electronic component is greatly enhanced, a line width in the electronic component is getting smaller and smaller, and the line density in the electronic component is getting higher and higher. Thus, the heat generated by the electronic component is increased rapidly. Taking a central processing unit (CPU) of a computer as an example, the Pentium CPU only has to be equipped with the package with the heat dissipating capability of 16 W at its early stage. However, the heat generated in the CPU in the year of 2004 has reached 84 W, and the heat generated in the CPU in the year of 2006 has reached 98 W. If the heat cannot be removed rapidly, the temperature of the CPU of the computer is rapidly increased so that the CPU of the computer can no longer operate. Thus, the heat dissipating ability of the substrate contacting with the CPU of the computer is a key factor for dominating whether the computer can operate normally or not.

A typical power component, such as a solid relay, is similar to the CPU of the computer and generates a lot of heat. Thus, the power component also dissipates the heat rapidly through the substrate contacting therewith so that it can operate normally.

Taking a light-emitting diode (LED) as another example, various color LEDs have been gradually developed, wherein the successful development of the white-light LED has attracted considerable attention. This is because the white-light LED can serve as a light source for an illumination lamp. The power consumption of a road lamp with LED light source is lower than that of a mercury lamp by 75% and is lower than that of a high pressure sodium lamp by 49%. So, the white-light LED advantageously has the low power consumption and can significantly save the energy. However, the white-light LED with the output power higher than 3 W has to be adopted in the application of the lamp used in the daily life and the applications such as the head light used in a vehicle. This white-light LED with the high output power also generates a lot of heat. However, the major barrier on the application of LED as the light source is that the LED cannot withstand the high temperature. Generally speaking, the temperature of the LED cannot exceed 90° C. If the temperature of the LED is higher than 90° C., the luminance thereof rapidly deteriorates. So, the rapid heat dissipating ability of the heat dissipation substrate in contact with the LED has become a greatest challenge for determining whether the LED can become the illumination light source or not. This also specifies that the development of the heat dissipating substrate has played an important role on the applications of the LED as the light source.

In order to satisfy the miniaturized requirement of the current 3C electronic product, the substrate contacting with the CPU of the computer, or the power component or the LED has to satisfy the following fundamental requirements.

First, the material must have a high heat conductivity to dissipate the heat rapidly.

Second, the material must have the high resistivity in order to prevent the high power electronic component from being short-circuited.

Third, the substrate preferably has to be as thin as possible after the above-mentioned conditions are satisfied.

Fourth, the substrate has to be used with the good reliability for a long time. This is because the high power electronic component, after being packaged, will encounter several tens of thousand times of on-off cycles, and the temperature of the substrate contacting with the high power electronic component is instantaneously increased and decreased therewith for several tens of thousand times. So, the reliability after the electronic component has been used for a long time is an extremely important requirement. This is absolutely associated with the bonding strength between the ceramic material and the metal material.

At present, the heat dissipating mechanisms of the electronic components, which are frequently used, include heat dissipating fins and a heat pipe accompanied with fans in order to dissipate the heat generated by the high power electronic components. However, such heat dissipating structure has a larger thickness, and the applications in designing a miniaturized 3C electronic product are thus hindered.

In order to satisfy the requirements on heat dissipating and to keep the size small and the price low, all materials are searched and evaluated. Taking the copper as an example, the copper has a high coefficient of thermal conductivity, which can reach 380 W/mK. There are many choices, which can satisfy the second requirement of insulation, because most polymeric organic materials or ceramic materials can satisfy this requirement. In order to satisfy the requirement of heat dissipating, the ceramic material is the better choice under the consideration of the long-term reliability. Among the ceramic materials, aluminum oxide and aluminum nitride can provide the high thermal conductivity and the high insulating resistance. The aluminum oxide has a coefficient of thermal conductivity, which can reach 20 to 38 W/mK, while the aluminum nitride has a coefficient of thermal conductivity, which can reach 40 to 200 W/mK. The coefficient of thermal conductivity of the ceramic material has a wider range because the coefficient of thermal conductivity of the ceramic material is significantly influenced by the purity of the ceramic material and the type of the sintering additive used. Furthermore, the resistivity of each of the aluminum oxide and the aluminum nitride can be equal to or greater than $10^{10}$ Ωm. Thus, the two ceramic materials have the excellent insulating properties. Furthermore, aluminum oxide and aluminum nitride have the low dielectric constant and the high dielectric strength, and are thus frequently used as the material for a substrate.

However, the aluminum oxide is a solid, which has a high melting point (higher than 2000° C.) and has the coexisted covalent bonds and ionic bonds. The copper atoms are combined with metallic bonds, and the copper has the melting point, which is only 1083° C. So, it is a great challenge to bond the aluminum oxide and the copper together. According to the report of Beraud, C., Courbiere, M., Esnouf, C., Juve, D., Treheux, D., J. Mater. Sci., 24, 4545, 1989, there are two conventional methods for bonding the aluminum oxide with the copper. The first method is the solid state bonding method, and the second method is the liquid phase bonding method, as disclosed in U.S. Pat. No. 3,993,411. The treating temperatures of these two methods are higher than 1000° C.

According to the research made by Seager et. al., (Seager, C. W., Kokini, K., Trumble, K., Krane, M. J. M., Scripta Materialia, 46, 395, 2002), the thick copper oxide is disadvantageous to the bonding between aluminum oxide and copper. After a long-term investigation, it is found that the substrate, formed by bonding an aluminum oxide sheet and a copper sheet together, cannot have the application value until the interface strength between the aluminum oxide sheet and the copper sheet reaches a very high level. This is because the aluminum oxide and the copper have different bonds, and the coefficient of thermal expansion of the copper ($17 \times 10^{-6} K^{-1}$) is two times of the coefficient of thermal expansion of the aluminum oxide ($8 \times 10^{-6} K^{-1}$). A formula derived by Selsing (Selsing, J., J. Am. Ceram. Soc., 44, 419, 1961) is listed in the following:

$$\sigma = \frac{\Delta \alpha \cdot \Delta T}{\frac{1+v_{Al2O3}}{2E_{Al2O3}} + \frac{1-2v_{Cu}}{2E_{Cu}}}.$$

In the above-mentioned formula, $\Delta \alpha$ denotes a difference between coefficients of thermal expansion of the aluminum oxide and the copper, $\Delta T$ denotes a difference between the room temperature and the manufacturing temperature, $\upsilon$ denotes the Poisson's ratio and E denotes the elastic constant. The temperature, at which the aluminum oxide sheet and the copper sheet are joined together is over 1000° C., so the estimated thermal stress induced by the thermal expansion mismatch between aluminum oxide and copper after the high temperature joining process can reach several hundreds of MPa. This thermal stress is very large and significantly influences the bonding strength between the aluminum oxide sheet and the copper sheet. In addition, after the aluminum oxide sheet and the copper sheet are joined together, the composite substrate is packaged together with electronic components. Since the electronic component may be turned on and off for several tens of thousand times, de-bonding may be formed at the interface between the aluminum oxide sheet and the copper sheet if the bonding strength between the aluminum oxide sheet and the copper sheet is not high enough. Thus, the heat spreading ability is greatly reduced, which significantly influences the reliability after the high power electronic component is used for a long time.

Thus, it is an important subject of the present invention to provide a ceramic/metal composite structure having a high bonding strength.

SUMMARY OF THE INVENTION

It is therefore an object of the present invention to provide a method of manufacturing a ceramic/metal composite structure, to provide a strong bond between ceramic and metal materials, and thus to provide the good heat dissipating and insulating properties for an electronic component under the considerations of the thinner dimension and the long-term reliability.

The invention achieves the above-mentioned objective by providing a method of manufacturing a ceramic/metal composite structure. The method includes the steps of performing a multi-stage pre-oxidizing process on a copper sheet; placing the copper sheet on a ceramic substrate; and heating the copper sheet and the ceramic substrate to a joining temperature to join the copper sheet and the ceramic substrate together to enhance interface strength between the copper sheet and the ceramic substrate according to the multi-stage pre-oxidizing process.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention.

DETAILED DESCRIPTION OF THE INVENTION

The present invention will be apparent from the following detailed description, which proceeds with reference to the accompanying drawings, wherein the same references relate to the same components.

Figure 1A:
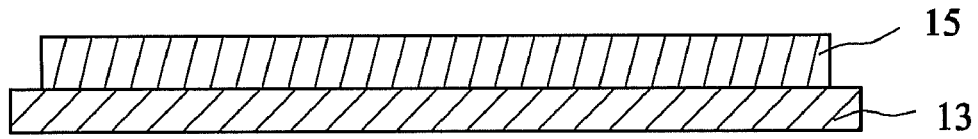
FIGS. 1A and 1B are schematically cross-sectional views showing two ceramic/metal composite structures according to a preferred embodiment of the invention.
Figure 1B:
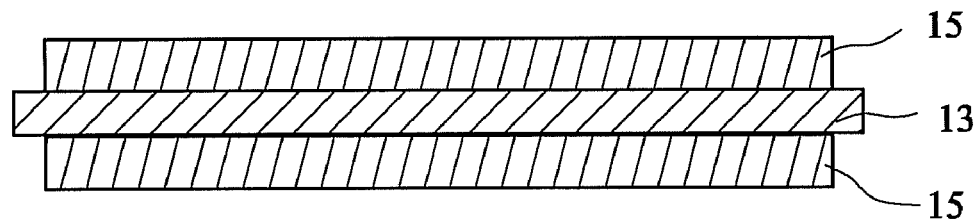
Figure 2:
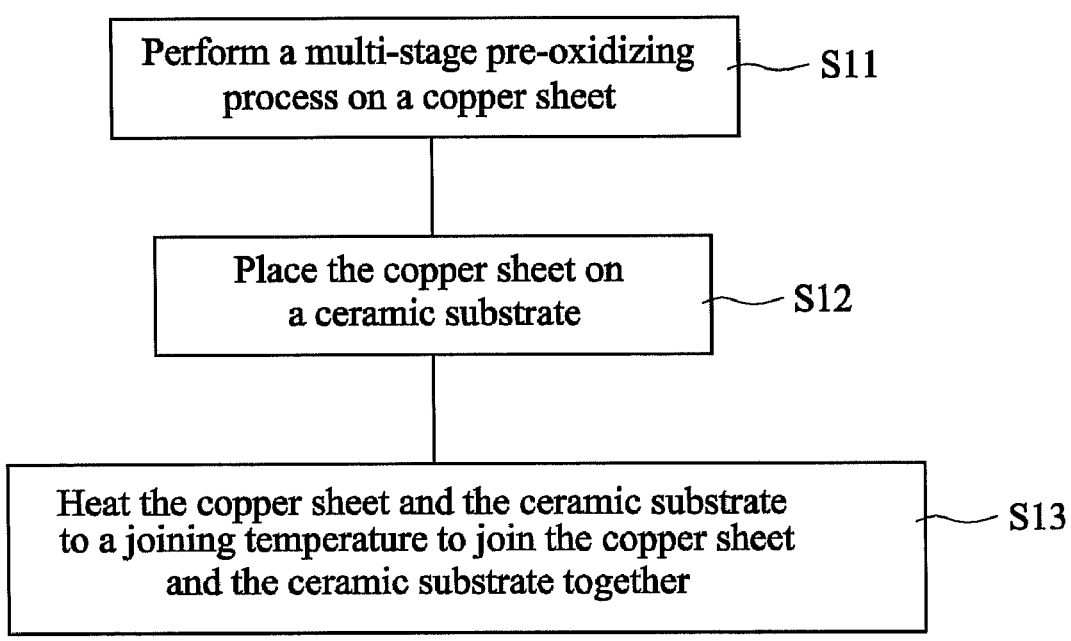
FIG. 2 is a flow chart showing a method of manufacturing the ceramic/metal composite structure according to the preferred embodiment of the invention.

FIGS. 1A and 1B are schematically cross-sectional views showing two ceramic/metal composite structures according to a preferred embodiment of the invention. FIG. 2 is a flow chart showing a method of manufacturing the ceramic/metal composite structure according to the preferred embodiment of the invention.

Referring to FIGS. 1A and 2, a method of manufacturing the ceramic/metal composite structure of this embodiment includes the steps S11 to S13.

First, in the step S11, a multi-stage pre-oxidizing process is performed on a copper sheet 15 after the copper sheet 15 is ground. The multi-stage pre-oxidizing process may include a first stage of pre-oxidizing process and a second stage of pre-oxidizing process. Alternatively, the multi-stage pre-oxidizing process may further include a third stage of pre-oxidizing process. The first, second and third stages of pre-oxidizing processes are conducted at different temperatures, for different time periods or in different atmospheres with different oxygen partial pressures according to the actual treatment of the invention. If the structure of FIG. 1B is to be formed, two copper sheets 15 may be prepared in the same manner.

For example, the temperature of at least one of the first, second and third stages of pre-oxidizing processes ranges from 50° C. to 700° C. A ratio of the absolute temperature (K) of the highest temperature of the first and second stages of pre-oxidizing processes to the absolute temperature of the melting point of copper is smaller than or equal to 0.75. The time period of at least one of the first, second and third stages of pre-oxidizing processes ranges from 1 to 600 minutes. The oxygen partial pressure in the atmosphere of at least one of the first, second and third stages of pre-oxidizing processes ranges from 0.01 to $1.1 \times 10^5$ Pa. An initial temperature of the second stage of pre-oxidizing process may be equal to a residual temperature of the copper sheet 15 after the first stage of pre-oxidizing process is completed. Alternatively, an initial temperature of the third stage of pre-oxidizing process may be equal to the residual temperature of the copper sheet 15 after the second stage of pre-oxidizing process is completed. The so-called residual temperature is the temperature for the copper sheet after the previous stage of pre-oxidizing process is performed and is rapidly removed from an oven, such as a continuous conveyor oven. At this time, the copper sheet contacts with the air and a next stage of oxidizing process is conducted. According to the experiment, it is proved that the effect of the invention can be obtained by the pre-oxidizing method using the residual temperature.

Then, in the step S12, the copper sheet 15 is placed on a ceramic substrate 13. In this embodiment, a material of the ceramic substrate 13 is selected from the group consisting of aluminum oxide, silicon oxide, aluminum nitride, silicon nitride, silicon carbide, glass and glass-ceramic material. If the structure of FIG. 1B is to be formed, the two copper sheets 15 may be placed on two sides of the ceramic substrate 13 and are thus electrically isolated from each other.

Next, as shown in the step S13, the copper sheet 15 and the ceramic substrate 13 are heated to a joining temperature to join together. The joining temperature ranges from a eutectic point (1066° C.) between the copper and the copper oxide to the melting point (1083° C.) of the copper. Alternatively, the joining temperature ranges from the eutectic point of the copper and the copper oxide to 1000° C. If the structure of FIG. 1B is to be formed, the copper sheets 15 and the ceramic substrate 13 are heated to a joining temperature to join together simultaneously in the same manner.

The effects of the invention will be described in the following examples.

First Example

Figure 3:
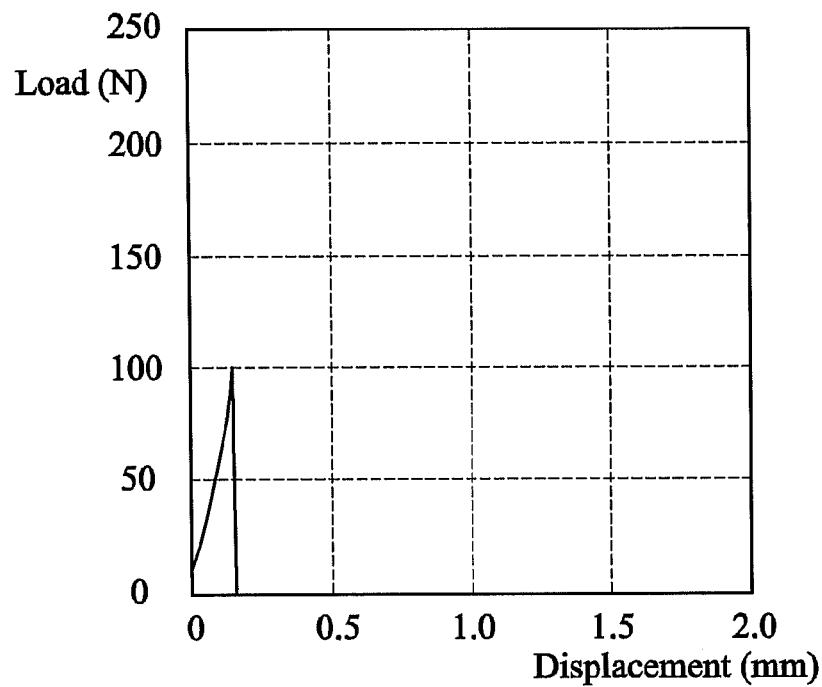
FIG. 3 shows a test result of an aluminum oxide substrate.

The aluminum oxide substrate, which has the purity of aluminum oxide of 96% and has the size of 32×23×0.5 mm, is tested by a universal testing machine (MTS-810, United States MTS Company) according to the 3-point bending method so that the load-displacement behavior of the substrate is obtained. Two lower supporting points to withstand the load are separated by 22.5 mm, and the load applying rate is 0.002 mm/second. The obtained load-displacement curve is shown in FIG. 3. As shown in FIG. 3, after the aluminum oxide substrate is applied with the load of 100 Newtons, an extremely small displacement is generated and the aluminum oxide substrate fails instantaneously. This phenomenon demonstrates a typical brittle failure.

Second Example

Figure 4:
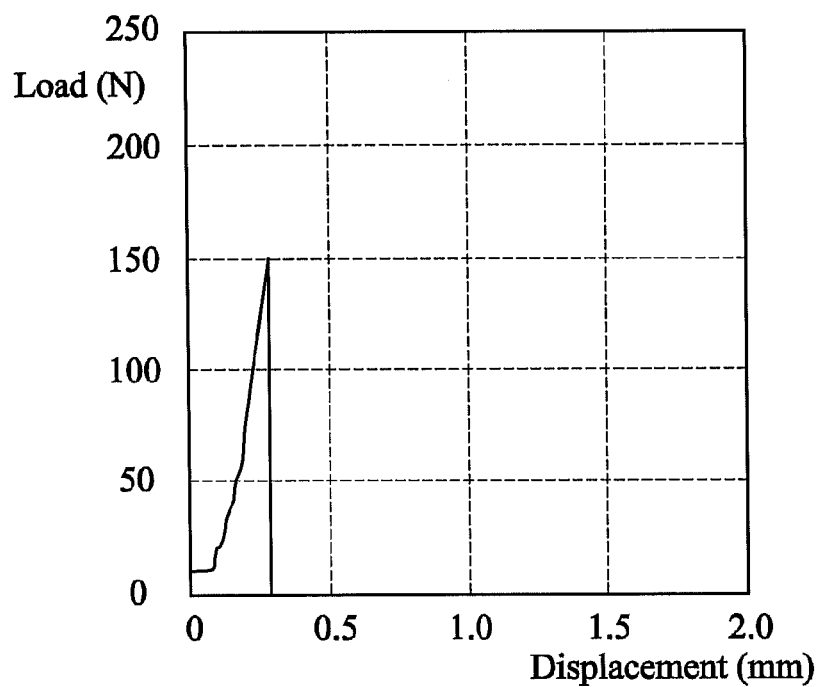
FIGS. 4 and 5 show test results each showing a composite structure composed of an aluminum oxide substrate and two single-stage pre-oxidized copper sheets.

The aluminum oxide substrate, which is the same as that of the first example, is cleaned by acetone and then joined to two copper sheets, each of which has the size of 26×20×0.3 mm and is pre-oxidized at 1000° C. for 1 hour in an atmosphere with low oxygen partial pressure, to form a sandwiched structure in a temperature-calibrated oven at the high temperature of 1073° C. in nitrogen. The joined composite structure is applied with the 3-point bending test, which is the same as that of the first example, and the obtained load-displacement curve is shown in FIG. 4. The aluminum oxide/copper composite structure withstands the load of 150 Newtons, then the load rapidly decreases. The aluminum oxide substrate within the structure is broken after test, and a large portion of the interface between the aluminum oxide substrate and the copper sheet is separated, and only a portion of the copper sheet is still joined to the aluminum oxide substrate.

The above-mentioned example proves that the aluminum oxide/copper composite structure can withstand the external load higher than that withstood by the aluminum oxide substrate alone. However, as a larger load is applied, the aluminum oxide/copper composite structure cannot be used any more. As the copper sheet is pre-oxidized in multiple stages, the interface strength can be effectively enhanced. Illustrations will be made with reference to the following example.

Third Example

Two commercial oxygen-free copper sheets having the size of 26×20×0.3 mm is slightly ground by the silicon carbide sand paper #200 so that the original oxidation layer on the surface is removed. Then, the copper sheets are cleaned by acetone so that the grease is removed. Next, the copper sheets are dried. Thereafter, each of the oxygen-free copper sheets recovers the original metal shine. Then, a nitrogen-oxygen analyzer based on an infrared spectroscopic analysis method is utilized to determine an oxygen content of each of the unoxidized copper sheets, and the analyzed result is smaller than 1 wt %.

Then, each of the commercial oxygen-free copper sheets is placed in a high-temperature quartz tube oven. Next, flowing nitrogen is supplied. The typical nitrogen has the oxygen content ranging from 0.01 ppm to several tens of ppm according to the supplied source. The gas flow rate is equal to 30 cc per minute. Then, the temperature is risen to 1000° C. for 10 hours and then lowered to the room temperature. Thereafter, the nitrogen-oxygen analyzer is utilized to analyze the oxygen content of each of the pre-oxidized copper sheets, and the analyzed result is still lower than 1 wt %. This example shows that the copper oxide (II) and/or the copper (I) oxide formed in the pre-oxidizing process can protect the residual copper from being oxidized rapidly. So, the increase of the pre-oxidizing time only has very limited effect on the increase of the oxygen content in the copper sheet.

Figure 5:
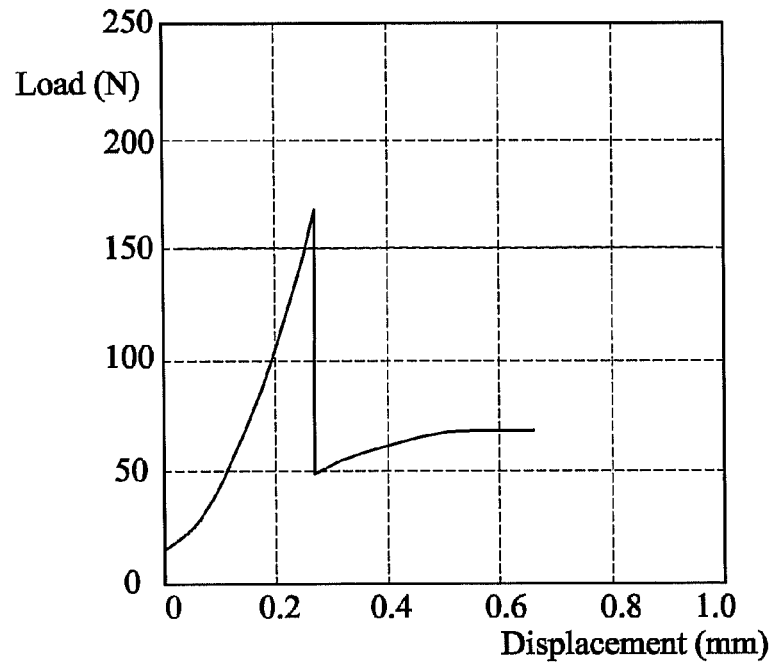

Next, the acetone is provided to clean the aluminum oxide substrate, and the aluminum oxide substrate is joined to the copper sheets, each of which has the thickness of 0.3 mm and has been pre-oxidized in one stage at 1000° C. for 10 hours, at 1074° C. in nitrogen and oxygen for 30 minutes. The joined substrate is tested with the 3-point bending technique, and the obtained load-displacement curve is shown in FIG. 5. The aluminum oxide/copper composite structure withstands the external force of 160 Newtons, and then the load suddenly decreases to 50 Newtons. The substrate after being tested has the partially separated interfaces between the copper sheets and the aluminum oxide substrate. Compared with the second example, this example shows that the interface strength between the copper sheet and the aluminum oxide can be increased with the increase of the pre-oxidizing time. However, when the aluminum oxide/copper composite structure withstands a larger force, the interface strength remained in the structure is not high. The one-stage pre-oxidizing method can be found in Yoshino, Y., J. Am. Ceram. Soc., 72, 1322-1327, 1989.

Fourth Example

A surface processing, such as grinding, and cleaning step is performed on the commercial oxygen-free copper sheets, and then a two-stage pre-oxidizing process is performed on the copper sheets. The condition of pre-oxidation is created in a high-temperature tube furnace supplied with nitrogen at the gas flow rate of 30 cc per minute. Then, the temperature is risen to 600° C. for several minutes and then lowered to the room temperature. Next, the second stage of pre-oxidizing process is performed, in which the temperature is risen to 200° C. in the air for several minutes and then lowered to the room temperature. Each of the copper sheets after being pre-oxidized in two stages is analyzed by the nitrogen-oxygen analyzer to obtain the oxygen content of the pre-oxidized copper sheet, and the analyzed result is lower than 1 wt %. A field emission scanning electron microscope is utilized to observe the oxidized copper sheet surface, and the observed result shows that the oxidized copper sheet surface is formed with a dense oxide film, which is advantageous to the joining between the aluminum oxide and the copper.

Figure 6:
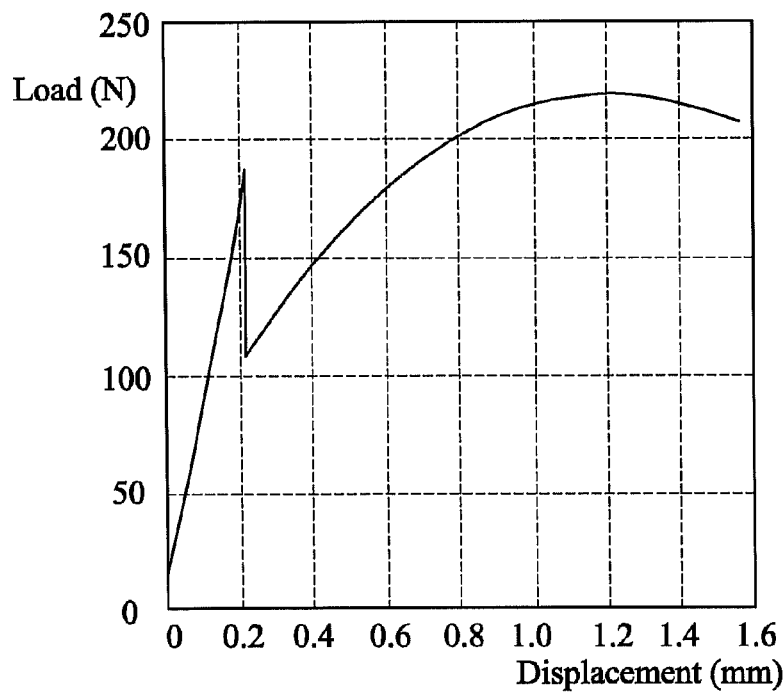
FIGS. 6 to 8 show test results each showing a composite structure composed of an aluminum oxide substrate and two multi-stage pre-oxidized copper sheets.

Then, the acetone is provided to clean the aluminum oxide substrate, which is joined to two copper sheets each being pre-oxidized by using two stages pre-oxidation treatments. The joining process is carried out in a temperature-calibrated oven at 1059° C. in flowing nitrogen for 10 minutes. The temperature (1059° C.) is lower than the eutectic temperature (1066° C.) of copper and copper oxide. The joined composite substrate is tested with the 3-point bending technique, and the obtained load-displacement curve is shown in FIG. 6. The aluminum oxide/copper composite structure can withstand the external force greater than that of the third example. After the external force reaches 180 Newtons, the load first decreases to 105 Newtons. At this time, it is observed that the aluminum oxide sheet is not separated from the copper sheet. The copper sheet still tightly grasps the aluminum oxide sheet so that the completeness of the composite structure can still be kept. As the load is continuously applied, the composite structure can still withstand a greater force because the aluminum oxide sheet and the copper sheet are not de-bonded at all. It is to be noted that the composite structure can generate the deformation of 1.6 mm, and the interface of the composite structure is still kept complete. After the detailed observation, the copper sheet of the composite structure is undergoing a plastic deformation in order to keep the interface intact.

Fifth Example

In this example, the two-stage pre-oxidizing process is performed on the copper sheets at the low temperature. Even if the lower pre-oxidizing temperature and the shorter pre-oxidizing time are adopted, the copper/aluminum oxide structure with the very high interface strength can still be obtained.

Figure 7:
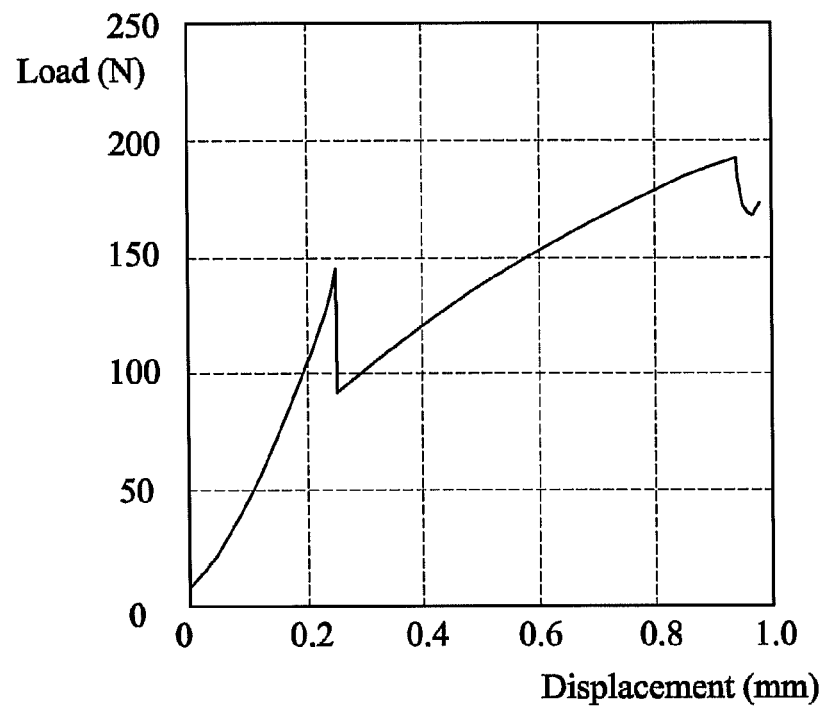

The pre-oxidizing conditions are similar to those in the fourth example. The first stage of pre-oxidizing process is performed at 600° C. for several minutes. Then, the copper sheets are quickly moved out of the oven so that the copper sheets with the residual temperature contact with the air outside the oven and further oxidation (second stage) is performed. Then, the pre-oxidized copper sheets are joined with the aluminum oxide substrate. Before joining, the aluminum oxide substrate is firstly cleaned by the acetone. Then, the aluminum oxide substrate is joined to two copper sheets, each of which has been pre-oxidized in two stages and has the thickness of 0.3 mm. The joining is performed in a temperature calibrated oven at 1060° C. in nitrogen for 6 minutes. The temperature (1060° C.) is lower than the eutectic temperature (1066° C.). The joined structure is tested with the 3-point bending technique, and the obtained load-displacement curve is shown in FIG. 7. The aluminum oxide/copper composite structure withstands the external force of 145 Newtons, and then the load firstly decreases to 90 Newtons. At this time, the aluminum oxide is not separated from the copper sheet. The copper sheet still tightly grasps the aluminum oxide sheet so that the completeness of the composite structure can be kept. If the force is continuously applied, the composite structure still can withstand a larger force of 195 Newtons and then the load slightly decreases. It is to be noted that the composite structure can generate the deformation of 1 mm while the interface of the composite structure is still intact.

Sixth Example

In this example, each of the copper sheets is applied with the two-stage pre-oxidizing process at the low temperature. In the two stages, a lower temperature pre-oxidizing process can be performed for the first stage and then a higher temperature pre-oxidizing process is performed for the second preoxidation stage. The pre-oxidizing time is still very short, but the higher interface strength of the copper/aluminum oxide structure still can be obtained.

The pre-oxidizing conditions are similar to those in the fourth example. In the first stage, the copper sheet with the size of 70×20×0.3 mm is pre-oxidized in the air at 250° C. for several minutes. In the second stage, the copper sheet is pre-oxidized at 600° C. for several minutes. Then, an aluminum oxide substrate with the size of 80×32×0.5 mm is cleaned by the acetone and then joined to two copper sheets each being pre-oxidized by using the two-stage process. The joining is performed in a temperature-calibrated oven at 1061° C. in nitrogen for 10 minutes. The temperature (1061° C.) is lower than the eutectic temperature (1066° C.) and the melting point (1083° C.) of copper.

Figure 8:
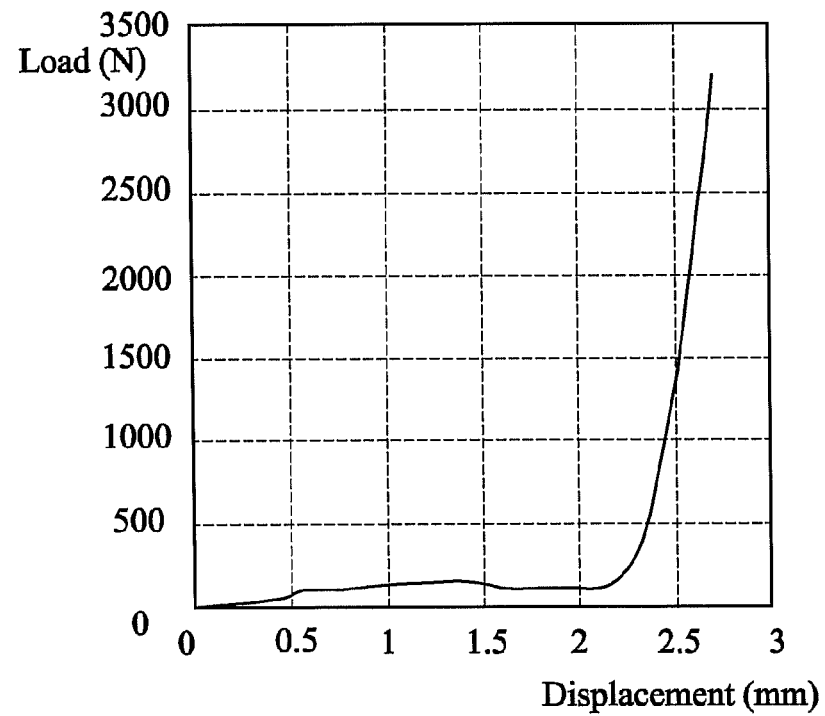

Then, a diamond blade is utilized to cut the aluminum oxide/copper composite structure into the size of 32×23×1.1 mm and then the 3-point bending test is performed. The loading rate is 0.05 mm/second, and the obtained load-displacement curve is shown in FIG. 8. The heat spreading substrate manufactured according to this example can withstand a larger force than that of the above-mentioned examples and the larger displacement can also be generated. It is observed that the aluminum oxide sheet of the tested composite structure is not separated from the copper sheet. The copper sheet still tightly grasps the aluminum oxide sheet. It is proved that the interface strength of the aluminum oxide/copper composite structure is very high so that the interface of the composite structure is not debonded after the test.

The above-mentioned examples illustrate the two-stage pre-oxidizing process, in which the surface of the copper sheet is treated with the lower temperatures and the short times. In addition, the interface strength is high, so it is extremely advantageous to the increase of the lifetime of the high power electronic component after several tens of thousand times of on-off cycles.

In summary, the present invention discloses a composite structure, which is composed of copper and aluminum oxide and provides the basic heat dissipating and insulating ability. Because the copper has the extremely low resistivity of only $10^{-4}$ Ωm, various patterns or connection points can be formed onto the copper sheet. The composite structure can be packaged with the high power electronic components. Both the good electrical connecting and heat dissipating properties can be achieved. In addition, the two-stage pre-oxidizing process is performed on the copper sheet to process the surface thereof with lower temperatures and short times. In addition, the composite structure has the high interface strength. So, it is extremely advantageous to the increase of the lifetime of the high power electronic component after several tens of thousand times of on-off cycles.

While the present invention has been described by way of examples and in terms of preferred embodiments, it is to be understood that the invention is not limited thereto. To the contrary, it is intended to cover various modifications. Therefore, the scope of the appended claims should be accorded the broadest interpretation so as to encompass all such modifications.

What is claimed is:

1. A method of manufacturing a ceramic/metal composite structure, the method comprising the steps of:
    performing a multi-stage pre-oxidizing process on a copper sheet, wherein the multi-stage pre-oxidizing process comprises a first stage of pre-oxidizing process and a second stage of pre-oxidizing process, and the first and second stages of pre-oxidizing processes are performed in atmospheres with different oxygen partial pressures and at different temperatures;
    after performing, placing the copper sheet on a ceramic substrate; and
    after placing, heating the copper sheet and the ceramic substrate to a joining temperature to join the copper sheet and the ceramic substrate together to enhance interface strength between the copper sheet and the ceramic substrate according to the multi-stage pre-oxidizing process.

2. The method according to claim 1, further comprising the step of:
    grinding the copper sheet before the multi-stage pre-oxidizing process is performed on the copper sheet so that the multi-stage pre-oxidizing process is performed on the ground copper sheet.

3. The method according to claim 1, wherein the temperature of the first stage of pre-oxidizing process ranges from 50° C. to 700° C.

4. The method according to claim 1, wherein the temperature of the second stage of pre-oxidizing process ranges from 50° C. to 700° C.

5. The method according to claim 1, wherein the temperature of each of the first and second stages of pre-oxidizing processes ranges from 50° C. to 700° C.

6. The method according to claim 1, wherein a time period of the first stage of pre-oxidizing process ranges from 1 minute to 600 minutes.

7. The method according to claim 1, wherein a time period of the second stage of pre-oxidizing process ranges from 1 minute to 600 minutes.

8. The method according to claim 1, wherein a dense oxide film is formed on the copper sheet after the multi-stage pre-oxidizing process is performed.

9. The method according to claim 1, wherein the oxygen partial pressure in the atmosphere of the first stage of pre-oxidizing process ranges from 0.01 Pa to $1.1 \times 10^5$ Pa.

10. The method according to claim 1, wherein the oxygen partial pressure in the atmosphere of the second stage of pre-oxidizing process ranges from 0.01 Pa to $1.1 \times 10^5$ Pa.

11. The method according to claim 1, wherein the oxygen partial pressure in the atmosphere of each of the first and second stages of pre-oxidizing processes ranges from 0.01 Pa to $1.1 \times 10^5$ Pa.

12. The method according to claim 1, wherein the first and second stages of pre-oxidizing processes are performed for different time periods.

13. The method according to claim 1, wherein a ratio of an absolute temperature of a highest one of the temperatures of the first and second stages of pre-oxidizing processes to an absolute temperature of a melting point of copper is smaller than or equal to 0.75.

14. The method according to claim 1, wherein the joining temperature ranges from a eutectic point between copper and copper oxide to a melting point of the copper.

15. The method according to claim 1, wherein the joining temperature ranges from a eutectic point between copper and copper oxide to 1000° C.

16. The method according to claim 1, wherein the multi-stage pre-oxidizing process further comprises a third stage of pre-oxidizing process different from the first and second stages of pre-oxidizing processes.

17. The method according to claim 1, wherein a material of the ceramic substrate is selected from the group consisting of aluminum oxide, silicon oxide, aluminum nitride, silicon nitride, silicon carbide, glass and glass-ceramic material.

18. A method of manufacturing a ceramic/metal composite structure, the method comprising the steps of:
    grinding each of two copper sheets;
    after grinding, performing a multi-stage pre-oxidizing process on each of the two ground copper sheets, wherein the multi-stage pre-oxidizing process comprises a first stage of pre-oxidizing process and a second stage of pre-oxidizing process, and the first and second stages of pre-oxidizing processes are performed in atmospheres with different oxygen partial pressures and at different temperatures;
    after performing, placing the copper sheets on two sides of a ceramic substrate; and
    after placing, heating the copper sheets and the ceramic substrate to a joining temperature to join the copper sheets and the ceramic substrate together to enhance interface strength between each of the copper sheets and the ceramic substrate according to the multi-stage pre-oxidizing process, wherein the copper sheets are electrically isolated from each other.

19. The method according to claim 18, wherein the multi-stage pre-oxidizing process further comprises a third stage of pre-oxidizing process different from the first and second stages of pre-oxidizing processes.

* * * * *